(12) United States Patent
Lange

(10) Patent No.: US 7,221,055 B2
(45) Date of Patent: May 22, 2007

(54) SYSTEM AND METHOD FOR DIE ATTACH USING A BACKSIDE HEAT SPREADER

(75) Inventor: Bernhard Lange, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/134,952

(22) Filed: May 23, 2005

(65) Prior Publication Data
US 2006/0263944 A1    Nov. 23, 2006

(51) Int. Cl.
*H01L 23/48* (2006.01)
*H01L 23/52* (2006.01)
*H01L 29/40* (2006.01)

(52) U.S. Cl. ............ 257/753; 257/751; 257/783; 257/775; 257/778; 257/E21.503; 257/E21.508; 257/E21.509; 257/781

(58) Field of Classification Search .......... None
See application file for complete search history.

(56) References Cited

U.S. PATENT DOCUMENTS

| | | | | |
|---|---|---|---|---|
| 5,371,404 A * | 12/1994 | Juskey et al. | ............ | 257/659 |
| 5,398,160 A * | 3/1995 | Umeda | ............ | 361/707 |
| 6,291,880 B1 * | 9/2001 | Ogawa et al. | ............ | 257/723 |
| 6,670,699 B2 * | 12/2003 | Mikubo et al. | ............ | 257/678 |
| 2005/0199998 A1 * | 9/2005 | Chen et al. | ............ | 257/706 |

* cited by examiner

*Primary Examiner*—Jasmine Clark
(74) *Attorney, Agent, or Firm*—Yingsheng Tung; Wade James Brady, III; Frederick J. Telecky, Jr.

(57) ABSTRACT

According to one embodiment of the invention, a method of die attach includes providing a chip, forming a heat conductive metal layer outwardly from a backside of the chip, and coupling the chip to a substrate. The heat conductive metal layer has a thickness of at least 0.5 mils.

18 Claims, 2 Drawing Sheets

SYSTEM AND METHOD FOR DIE ATTACH USING A BACKSIDE HEAT SPREADER

TECHNICAL FIELD OF THE INVENTION

This invention relates generally to the field of integrated circuit packaging and, more specifically, to a system and method for die attach using a backside heat spreader.

BACKGROUND OF THE INVENTION

Decreasing power transistor sizes, among other factors, are increasing power dissipation needs. In an integrated circuit package, heat is typically distributed from the chip surface through the chip, through the die attach material, and through the leadframe die pad and/or external heat sink. Current die attach materials, such as solder and epoxy, may have voids therein that impact this thermal heat transfer from the chip surface. This voiding may cause local hot spots on the die surface due to decreased thermal conductivity at these spots. Overheating of the output power transistor or other chip elements can be the cause of reliability failures.

SUMMARY OF THE INVENTION

According to one embodiment of the invention, a method of die attach includes providing a chip, forming a heat conductive metal layer outwardly from a backside of the chip, and coupling the chip to a substrate. The heat conductive metal layer has a thickness of at least 0.5 mils.

Some embodiments of the invention provide numerous technical advantages. Other embodiments may realize some, none, or all of these advantages. For example, a heat conductive backside metal layer facilitates improved heat dissipation from a chip surface to a heatsink. In addition, such a heat conductive backside metal layer may be soldered directly on a board or electrical substrate, eliminating the need for a die pad in an exposed pad package.

Other technical advantages are readily apparent to one skilled in the art from the following figures, descriptions, and claims.

BRIEF DESCRIPTION OF THE DRAWINGS

For a more complete understanding of the invention, and for further features and advantages, reference is now made to the following description, taken in conjunction with the accompanying drawings, in which.

DETAILED DESCRIPTION OF EXAMPLE EMBODIMENTS OF THE INVENTION

Example embodiments of the present invention and their advantages are best understood by referring now to FIGS. 1 through 5 of the drawings, in which like numerals refer to like parts.

Figure 1:
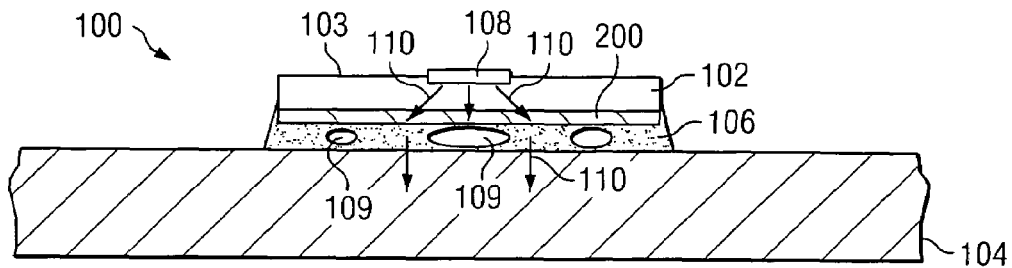
FIG. 1 is a cross-sectional view of a chip having a heat conductive backside metal layer attached to a heatsink according to one embodiment of the invention.

FIG. 1 is a cross-sectional view of a die attach system 100 according to one embodiment of the invention. In the illustrated embodiment, system 100 includes a semiconductor chip 102 having a heat conductive backside metal layer 200 coupled to a substrate 104 with a die attach material 106. As described in greater detail below, heat conductive backside metal layer 200 facilitates improved heat dissipation from semiconductor chip 102 down into substrate 104.

Chip 102 may be any suitable semiconductor chip or die having any suitable size and shape and may be formed from any suitable type and number of layers of material. Chip 102 also has any suitable electronic components associated therewith. For example, as illustrated in FIG. 1, one or more power transistors 108 may be coupled to top surface 103 of chip 102. Components associated with chip 102, such as power transistor 108, generate heat that needs to be dissipated down through the thickness of chip 102, through heat conductive backside metal layer 200, through die attach material 106, and into substrate 104, as generally indicated by arrows 110. Heat conductive backside metal layer 200 facilitates this dissipation by acting as a heat distribution layer to spread the heat generated by power transistor 108 or other components associated with chip 102 around one or more voids 109 that develop in die attach material 106 during the coupling of chip 102 to substrate 104. Heat conductive backside metal layer 200 is described in further detail below in conjunction with FIG. 2.

Die attach material 106 may be any suitable die attach material, such as an epoxy, a film adhesive, or solder. Die attach material 106 may have any suitable thickness. Substrate 104 may be any suitable substrate that acts as a heat sink and may have any suitable size and shape. In one embodiment, substrate 104 is a lead frame formed from a suitable metal.

Figure 2:
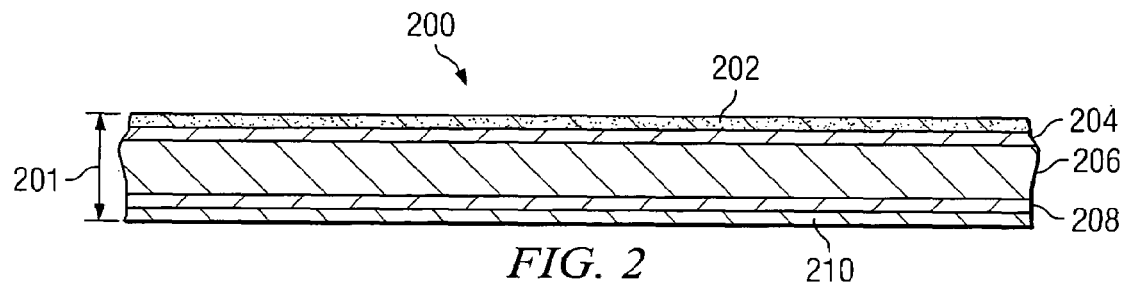
FIG. 2 is a cross-sectional view of the heat conductive backside metal layer of FIG. 1 according to one embodiment of the invention.

Referring to FIG. 2, a cross-sectional view of heat conductive backside metal layer 200 according to one embodiment of the invention is illustrated. In one embodiment, heat conductive backside metal layer 200 includes a thickness 201 of at least 0.5 mils. In a more particular embodiment of the invention, thickness 201 is at last 0.5 mils and no more than 4.0 mils. In the illustrated embodiment, heat conductive backside metal layer 200 includes an adhesive metal layer 202, a barrier metal layer 204, a metal layer 206, a barrier metal layer 208, and a solderable metal layer 210. The present invention contemplates heat conductive backside metal layer 200 having more, fewer, or different components than those shown in FIG. 2.

Heat conductive backside metal layer 200 may be formed on chip 102 in any suitable manner, such as backside sputtering, electroplating, or other suitable processing methods. The formation of heat conductive backside metal layer 200 is preferably formed at the wafer level.

Adhesive metal layer 202 may have any suitable thickness and may be formed from any suitable material, such as chromium, titanium, and titanium tungsten. Adhesive metal layer 202 functions as an adhesion layer for the subsequent layers of heat conductive backside metal layer 200. Adhesive metal layer 202 may not exist if the material used for metal layer 206 has enough adhesive properties to be able to adhere to the backside of chip 102.

Barrier metal layer 204 is also an optional layer that may have any suitable thickness and may be formed from any suitable material, such as nickel, copper, and titanium tungsten. Barrier metal layer 204 acts as a diffusion barrier for metal layer 206.

Metal layer 206 may be formed from any suitable heat conductive metal, such as copper, nickel, palladium, tungsten, gold, and silver. In one embodiment of the invention, metal layer 206 has a thickness of at least 0.5 mils. Metal layer 206 is the primary layer that acts as a heat distribution layer to spread the heat generated by power transistor 108 or other components associated with chip 102.

Barrier metal layer 208 is also an optional layer for heat conductive backside metal layer 200 and may have any suitable thickness and be formed from any suitable material, such as nickel or titanium tungsten. Barrier metal layer 208 acts as a diffusion barrier so that metal layer 206 does not diffuse into the solder during a solder process or higher exposed package temperatures.

Solderable metal layer 210 may have any suitable thickness and be formed from any suitable material, such as palladium, gold, or silver. Solderable metal layer 210, which is an optional layer, functions to allow heat conductive backside metal layer 200 to be soldered to a substrate, such as substrate 104, during a solder die attach process. Generally, solderable metal layer 210 dissolves into the liquid solder, which then wets to the barrier metal layer 208.

According to an operation of one embodiment of the invention, and referring to FIGS. 1 and 2, chip 102 having power transistor 108 or other electronic components associated therewith is provided with heat conductive backside metal layer 200. Each of the layers that form heat conductive backside metal layer 200 is formed on the backside of chip 102 before chip 102 is coupled to substrate 104 with die attach material 106. Voids 109 may develop in die attach material 106 during the coupling of chip 102 to substrate 104. During operation of chip 102, heat is generated by power transistor 108 and other electronic components, which needs to be dissipated in order to prevent local hot spots within chip 102 caused by voids 109. Heat conductive backside metal layer 200 acts as a heat distribution layer to spread the heat generated by power transistor 108 around the voids and into substrate 104.

Figure 3:
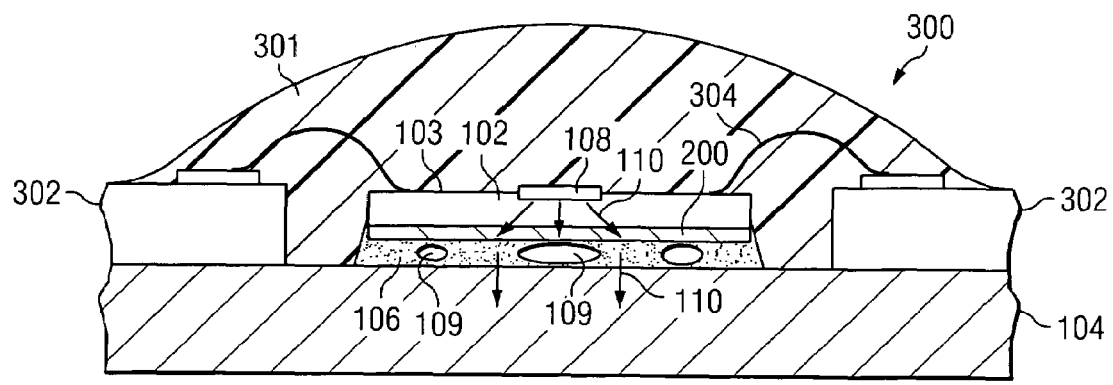
FIGS. 3 through 5 illustrate various packages incorporating the chip with a heat conductive backside metal layer according to various embodiments of the invention.
Figure 4:
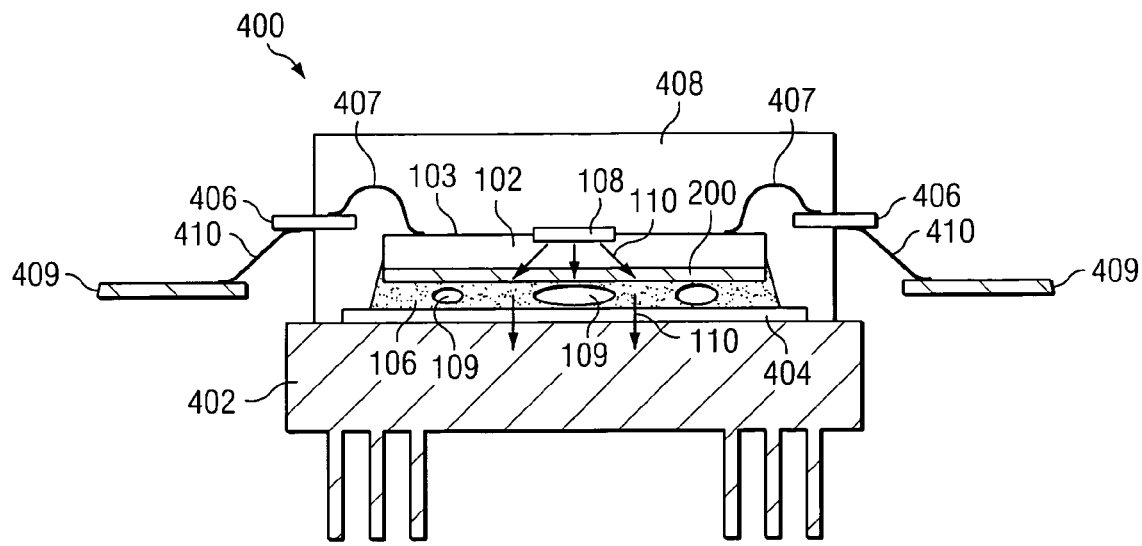
Figure 5:
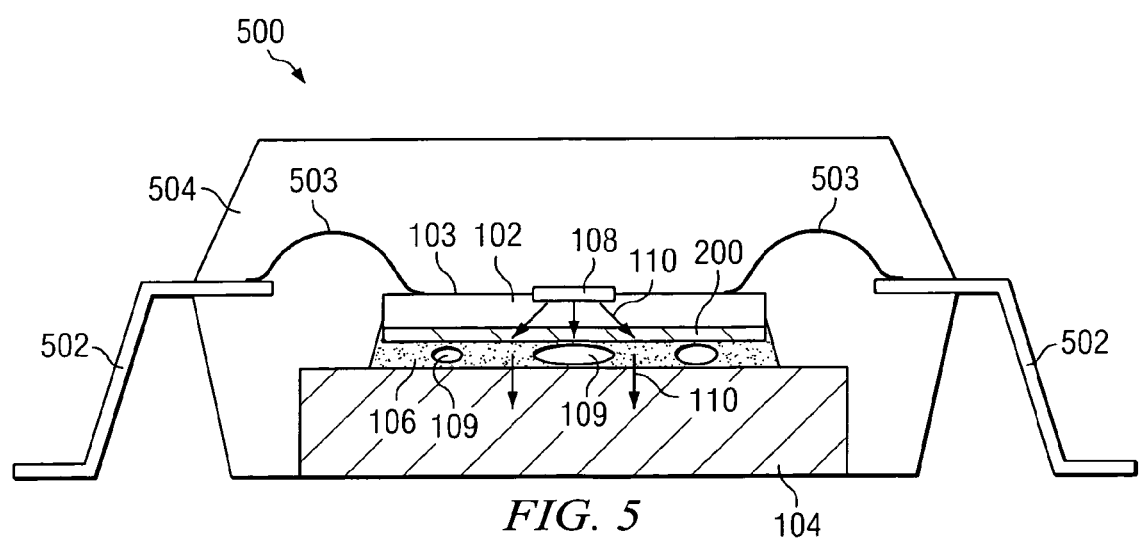

FIGS. 3 through 5 illustrate various packaging methods incorporating chip 102 with heat conductive backside metal layer 200 according to various embodiments of the invention. Referring first to FIG. 3, a package 300 is illustrated in which chip 102 is coupled to a printed circuit board 302 with a plurality of wire bonds 304. In order to encapsulate chip 102, a glob top 301 may be utilized. Glob top 301 may be formed from any suitable material, such as a suitable mold compound. Printed circuit board 302 may be any suitable printed circuit board formed from any suitable material.

FIG. 4 illustrates one embodiment of a package 400 in which die attach material 106 is solder for a direct solder die attach method. In other embodiments, die attach material 106 may be an epoxy or a film adhesive. Chip 102 having heat conductive backside metal layer 200 is coupled to an external heat spreader 402 having a solderable metal layer 404 at a location where chip 102 is desired to be placed. External heat spreader may be any suitably sized and shaped heat sink and solderable metal layer 404 may be formed from any suitable material with any suitable thickness. Chip 102 is also coupled to a plurality of lead connections 406 with a plurality of wire bonds 407 and thereafter encapsulated with an encapsulant 408, which may be any suitable encapsulation material. Lead connections 406 may then be coupled to a suitable printed circuit board 409 with a plurality of wire bonds 410. In an alternative embodiment, chip 102 may be coupled through wire bonds 407 directly to printed circuit board 409. Lead connections 406 may be soldered or otherwise electrically coupled to printed circuit board 409.

FIG. 5 illustrates a package 500, which resembles a conventional integrated circuit package for surface mount technology or through hole mount on a printed circuit board. In this embodiment, chip 102 is coupled to substrate 104 with die attach material 106 before being coupled to a plurality of lead connections 502 with a plurality of wirebonds 503. Chip 102 is thereafter encapsulated by a suitable encapsulant 504, which may be any suitable encapsulation material. Although lead connections 502 are illustrated in FIG. 5 as being formed downwardly towards substrate 104, the present invention contemplates lead connections 502 being formed away from substrate 104. In an alternative embodiment of FIG. 5, substrate 104 may be the same type of material and thickness as lead connections 502, and may be integral with lead connections 502.

Although embodiments of the invention and their advantages are described in detail, a person skilled in the art could make various alterations, additions, and omissions without departing from the spirit and scope of the present invention, as defined by the appended claims.

What is claimed is:

1. A method of die attach, comprising:
   providing a chip;
   forming a heat conductive metal layer outwardly from a backside of the chip, including the steps of:
      forming an adhesive metal layer outwardly from the backside of the chip;
      forming a barrier metal layer outwardly from the adhesive metal layer;
      forming a metal layer outwardly from the barrier metal layer, the metal layer having a thickness of at least 0.5 mils; and forming a solderable metal layer outwardly from the metal layer; and
   coupling the chip to a substrate.

2. The method of claim 1, wherein the chip comprises at least one power transistor.

3. The method of claim 1, wherein coupling the chip to the substrate comprises coupling the chip to the substrate with an epoxy.

4. The method of claim 1, wherein coupling the chip to the substrate comprises coupling the chip to the substrate with a film adhesive.

5. The method of claim 1, wherein coupling the chip to the substrate comprises coupling the chip to the substrate with a solder.

6. The method of claim 1, wherein the heat conductive metal layer has a thickness of at least 0.5 mils and no more than 4.0 mils.

7. The method of claim 1, further comprising wirebonding the chip to the substrate.

8. A system of die attach, comprising:
   a chip;
   a heat conductive metal layer including:
      an adhesive metal layer formed on the backside of the chip;
      a barrier metal layer formed on the adhesive metal layer;
      a metal layer having a thickness of at least 0.5 mils formed on the barrier metal layer; and
      a solderable metal layer formed on the metal layer; and
   a die attach material coupling the chip to a substrate.

9. The system of claim 8, wherein the chip comprises at least one power transistor.

10. The system of claim 8, wherein the die attach material comprises an epoxy.

11. The system of claim 8, wherein the die attach material comprises a film adhesive.

12. The system of claim 8, wherein the die attach material comprises a solder.

13. The system of claim 8, wherein the heat conductive metal layer has a thickness of at least 0.5 mils and no more than 4.0 mils.

14. The system of claim 8, wherein the substrate is a leadframe and further comprising a plurality of wirebonds coupling the chip to the leadframe.

15. A method of die attach, comprising:
 providing a chip;
 forming an adhesive metal layer outwardly from the backside of the chip;
 forming a barrier metal layer outwardly from the adhesive metal layer;
 forming a metal layer outwardly from the barrier metal layer, the metal layer having a thickness of at least 0.5 mils and no more than 4.0 mils;
 forming a solderable metal layer outwardly from the metal layer; and
 coupling the chip to a substrate with a die attach material.

16. The method of claim 15, wherein coupling the chip to the substrate comprises coupling the chip to the substrate with a die attach material selected from the group consisting of an epoxy, a film adhesive, and a solder.

17. The method of claim 15, wherein the metal layer is formed from a material selected from the group consisting of copper, nickel, palladium, tungsten, gold, and silver.

18. The method of claim 15, further comprising forming a second barrier metal layer between the metal layer and the solderable metal layer.

* * * * *